(12) United States Patent
Srinivas et al.

(10) Patent No.: US 9,947,377 B2
(45) Date of Patent: *Apr. 17, 2018

(54) PROVIDING MEMORY TRAINING OF DYNAMIC RANDOM ACCESS MEMORY (DRAM) SYSTEMS USING PORT-TO-PORT LOOPBACKS, AND RELATED METHODS, SYSTEMS, AND APPARATUSES

(71) Applicant: QUALCOMM Incorporated, San Diego, CA (US)

(72) Inventors: Vaishnav Srinivas, San Diego, CA (US); Michael Joseph Brunolli, Escondido, CA (US); Dexter Tamio Chun, San Diego, CA (US); David Ian West, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/622,772

(22) Filed: Jun. 14, 2017

(65) Prior Publication Data

US 2017/0278554 A1     Sep. 28, 2017

Related U.S. Application Data

(63) Continuation of application No. 14/589,145, filed on Jan. 5, 2015, now Pat. No. 9,767,868.
(Continued)

(51) Int. Cl.
   *G06F 12/02*     (2006.01)
   *G11C 7/10*     (2006.01)
   *G11C 29/02*     (2006.01)

(52) U.S. Cl.
   CPC ......... *G11C 7/1072* (2013.01); *G11C 29/022* (2013.01); *G11C 29/028* (2013.01)

(58) Field of Classification Search
CPC .... G11C 7/1072; G11C 29/028; G11C 29/022
See application file for complete search history.

(56) References Cited

U.S. PATENT DOCUMENTS

| 8,131,915 B1 | 3/2012 | Yang |
| 9,256,531 B2 | 2/2016 | Cho |
| (Continued) | | |

FOREIGN PATENT DOCUMENTS

| WO | 2010065290 A2 | 6/2010 |
| WO | 2013060361 A1 | 5/2013 |

OTHER PUBLICATIONS

Author Unknown, "Post LPDDR4 (LPDRAM5) Proposal," JC42.6, Dec. 2014, JEDEC, 11 pages.
(Continued)

*Primary Examiner* — Hiep Nguyen
(74) *Attorney, Agent, or Firm* — Withrow & Terranova, PLLC

(57) ABSTRACT

Providing memory training of dynamic random access memory (DRAM) systems using port-to-port loopbacks, and related methods, systems, and apparatuses are disclosed. In one aspect, a first port within a DRAM system is coupled to a second port via a loopback connection. A signal is sent to the first port from a System-on-Chip (SoC), and passed to the second port through the loopback connection. The signal is then returned to the SoC, where it may be examined by a closed-loop engine of the SoC. A result corresponding to a hardware parameter may be recorded, and the process may be repeated until an optimal result for the hardware parameter is achieved at the closed-loop engine. By using a port-to-port loopback configuration, the DRAM system parameters regarding timing, power, and other parameters associated with the DRAM system may be trained more quickly and with lower boot memory usage.

19 Claims, 5 Drawing Sheets

Related U.S. Application Data

(60) Provisional application No. 61/930,980, filed on Jan. 24, 2014.

(56) References Cited

U.S. PATENT DOCUMENTS

| | | |
|---|---|---|
| 9,330,031 B2 | 5/2016 | Gupta |
| 2004/0128451 A1 | 7/2004 | Edirisooriya et al. |
| 2004/0267481 A1* | 12/2004 | Resnick ............... G11C 29/26 702/117 |
| 2005/0197082 A1 | 9/2005 | Agostinelli |
| 2005/0210308 A1 | 9/2005 | Best et al. |
| 2008/0130986 A1 | 6/2008 | Bae et al. |
| 2008/0205170 A1 | 8/2008 | Ikeda |
| 2009/0244997 A1 | 10/2009 | Searles et al. |
| 2011/0283060 A1 | 11/2011 | Ware et al. |
| 2014/0006864 A1 | 1/2014 | Menon et al. |
| 2014/0019817 A1 | 1/2014 | Park et al. |
| 2015/0213849 A1 | 7/2015 | Srinivas et al. |
| 2015/0378956 A1 | 12/2015 | Dearth et al. |

OTHER PUBLICATIONS

International Search Report and Written Opinion for PCT/US2015/010218, dated Apr. 24, 2015, 14 pages.

Second Written Opinion for PCT/US2015/010218, dated Dec. 17, 2015, 9 pages.

Third Written Opinion for PCT/US2015/010218, dated Apr. 13, 2016, 6 pages.

* cited by examiner

PROVIDING MEMORY TRAINING OF DYNAMIC RANDOM ACCESS MEMORY (DRAM) SYSTEMS USING PORT-TO-PORT LOOPBACKS, AND RELATED METHODS, SYSTEMS, AND APPARATUSES

PRIORITY APPLICATIONS

The present application claims priority to and is a continuation of U.S. patent application Ser. No. 14/589,145, now U.S. Pat. No. 9,767, 868, filed on Jan. 5, 2015 and entitled "PROVIDING MEMORY TRAINING OF DYNAMIC RANDOM ACCESS MEMORY (DRAM) SYSTEMS USING PORT-TO-PORT LOOPBACKS, AND RELATED METHODS, SYSTEMS, AND APPARATUSES," which is incorporated herein by reference in its entirety.

The '145 application claims priority to U.S. Provisional Patent Application Ser. No. 61/930,980, filed on Jan. 24, 2014 and entitled "SYSTEMS AND METHODS FOR TRAINING MEMORY," which is incorporated herein by reference in its entirety.

BACKGROUND

I. Field of the Disclosure

The technology of the disclosure relates generally to memory systems.

II. Background

Computing systems rely on memory for both storage and operation. One common type of memory that computing systems use for operation is random access memory (RAM). RAM has two distinct types—static RAM (SRAM) and dynamic RAM (DRAM). DRAM relies on the presence or absence of a charge on a capacitor in a memory array to indicate a bit value. For example, if the capacitor is charged, the bit value is considered to be a logical one (1). If the capacitor is not charged, the bit value is considered to be a logical zero (0). Because capacitors slowly lose charge, a periodic refresh is applied. When power is terminated, all capacitors discharge, and the memory loses whatever data was present in the DRAM.

Variations in manufacturing processes may result in variations that produce imperfect DRAM, in that not every element in a DRAM module may work as intended. However, when provided knowledge regarding such variations, computing systems may readily compensate for the variations. For example, a computing system may generate greater or lesser voltages to charge the capacitors, may provide compensation for latency, or may even avoid any attempts to write to or read from a completely defective bit cell. Before the computing system may take such remedial steps, though, the computing system needs to determine which DRAM memory array elements (e.g., an individual bit cell) are operational, and what idiosyncrasies may be associated with a particular DRAM memory array element and/or with pathways for communicating with the DRAM memory array elements. Accordingly, the computing system may carry out training operations to optimize a link to a DRAM memory array element for timing and performance, as non-limiting examples.

Conventional training methods rely on serial testing of DRAM memory array elements. For example, in conventional write testing, a write command to a DRAM memory array element is initiated, data is written to the DRAM memory array element, and the data is then read from the DRAM memory array element. A training state machine (or software) may then compare the write data to the read data, and determine whether to modify (e.g., increment or decrement) the parameter that is being trained. While effective, this process may require substantial boot memory to implement, and may be time-consuming due to the DRAM memory access write command and read command that must be issued before a comparison may be made. Moreover, the comparison step may be iterated many times before a final optimal value may be determined. Thus, an improved technique to train memory may be desirable.

SUMMARY OF THE DISCLOSURE

Aspects disclosed herein enable providing memory training of dynamic random access memory (DRAM) systems using port-to-port loopbacks. Related methods, systems, and apparatuses are also disclosed. In an exemplary aspect, a first port within a DRAM system is coupled to a second port via a loopback connection. A training signal is sent to the first port from a System-on-Chip (SoC) and passed to the second port through the loopback connection without needing to be written to or read from a memory array of the DRAM system. The training signal is then returned to the SoC, where it may be examined by a closed-loop training engine of the SoC. A training result corresponding to a hardware parameter may be recorded, and the process may be repeated until an optimal result for the hardware parameter is achieved at the closed-loop training engine. By using a port-to-port loopback configuration, the DRAM system parameters regarding timing, power, and other parameters associated with the DRAM system may be trained more quickly and with lower boot memory usage.

In another aspect, a method for providing memory training for a DRAM system is provided. The method comprises receiving, by a first port of a DRAM system, a training signal from an SoC. The method further comprises providing, by the first port of the DRAM system, the training signal to a second port of the DRAM system via a loopback connection. The method also comprises providing, by the second port of the DRAM system, the training signal to the SoC.

In another aspect, a system for providing memory training for a DRAM system is provided. The system comprises an SoC communicatively coupled to a DRAM system. The DRAM system comprises a first port and a second port communicatively coupled via a loopback connection. The DRAM system is configured to receive, by the first port of the DRAM system, a training signal from the SoC. The DRAM system is further configured to provide, by the first port of the DRAM system, the training signal to the second port of the DRAM system via the loopback connection. The DRAM system is also configured to provide, by the second port of the DRAM system, the training signal to the SoC.

In another aspect, an apparatus comprising a DRAM system is provided. The DRAM system is configured to receive, by a first port of a DRAM system, a training signal from an SoC. The DRAM system is further configured to provide, by the first port of the DRAM system, the training signal to a second port via a loopback connection. The DRAM system is also configured to provide, by the second port of the DRAM system, the training signal to the SoC.

DETAILED DESCRIPTION

Figure 1:
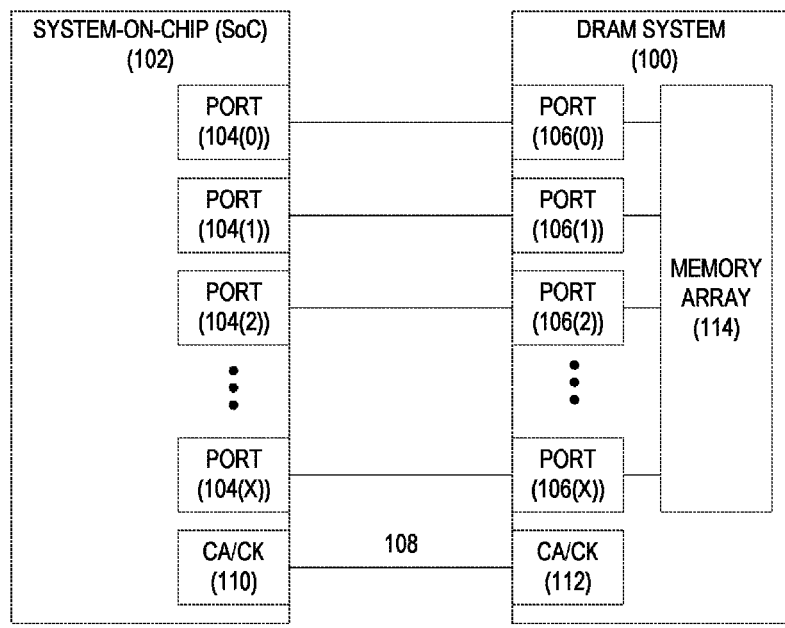
FIG. 1 is a block diagram of a conventional dynamic random access memory (DRAM) system communicatively coupled to a System-on-Chip (SoC), as is known in the art.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein enable providing memory training of dynamic random access memory (DRAM) systems using port-to-port loopbacks. Related methods, systems, and apparatuses are also disclosed. In an exemplary aspect, a first port within a DRAM system is coupled to a second port via a loopback connection. A training signal is sent to the first port from a System-on-Chip (SoC) and passed to the second port through the loopback connection without needing to be written to or read from a memory array of the DRAM system. The training signal is then returned to the SoC, where it may be examined by a closed-loop training engine of the SoC. A training result corresponding to a hardware parameter may be recorded, and the process may be repeated until an optimal result for the hardware parameter is achieved at the closed-loop training engine. By using a port-to-port loopback configuration, the DRAM system parameters regarding timing, power, and other parameters associated with the DRAM system may be trained more quickly and with lower boot memory usage.

Figure 2:
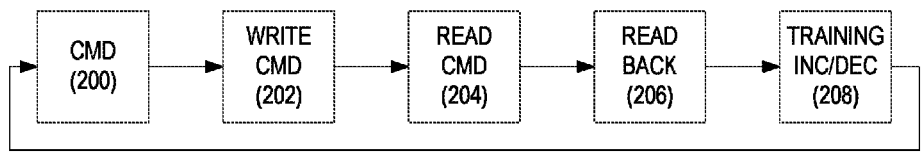
FIG. 2 is a simplified flowchart for an exemplary training process associated with the DRAM system and the SoC of FIG. 1.

Before addressing exemplary aspects of the methods, systems, and apparatuses disclosed herein for providing memory training of DRAM systems using port-to-port loopbacks, a brief review of conventional training techniques are provided with reference to FIGS. 1 and 2. Discussion of exemplary hardware and operations associated with the methods, systems, and apparatuses for training of DRAM systems using port-to-port loopbacks begins below with reference to FIG. 3.

In this regard, FIG. 1 is a block diagram of a conventional training scheme for a DRAM system 100 communicatively coupled to an SoC 102, as is known in the art. As illustrated, the SoC 102 provides ports 104(0)-104(X), each of which is coupled to a corresponding port 106(0)-106(X) provided by the DRAM system 100. As used herein, a "port" refers to a self-timed unit that may be retimed using a common strobe or clock (not shown) at the receiver (e.g., the DRAM system 100). In some aspects, each of the ports 104(0)-104(X) and 106(0)-106(X) is configured to transfer a specific number of bits of information at a time. As a non-limiting example, the ports 104(0)-104(X) and 106(0)-106(X) may be configured to transfer eight (8) bits of information at a time, in which case each of the ports 104(0)-104(X) and 106(0)-106(X) may be referred to as a "byte lane."

The SoC 102 and the DRAM system 100 are further coupled by a command and clock ("CA/CK") line 108 connecting CA/CK elements 110 and 112, respectively. The CA/CK line 108 may be used to communicate command and processor clock signals between the SoC 102 and the DRAM system 100. The ports 106(0)-106(X) in the DRAM system 100 are communicatively coupled to a memory array 114 within the DRAM system 100. In some aspects, the memory array 114 may comprise capacitors (not shown) or other elements for indicating logical values. It is to be understood that some aspects as provided herein may provide more or fewer ports 104(0)-104(X) and/or 106(0)-106(X). In some aspects, the SoC 102 and/or the DRAM system 100 may include additional elements not shown in FIG. 1 for the sake of clarity.

As noted above, the SoC 102 may need to determine at startup time whether any corrective or compensatory actions need to be taken when accessing elements of the DRAM system 100 due, for instance, to manufacturing variances or idiosyncrasies. For example, the SoC 102 may need to determine whether any timing or performance issues are associated with the ports 106(0)-106(X) of the DRAM system 100 or the communication pathways thereto. Accordingly, the SoC 102 may carry out training operations to optimize the ports 106(0)-106(X) of the DRAM system 100 to optimize timing and/or performance, as non-limiting examples.

FIG. 2 provides a simplified flowchart of a conventional training process associated with the SoC 102 and the DRAM system 100 of FIG. 1. For the sake of clarity, elements of FIG. 1 are referenced in describing the operations of FIG. 2. The training process described herein may be used to set a hardware parameter (not shown) associated with, for instance, timing and/or voltage used by the SoC 102 in communicating with the DRAM system 100.

The conventional training process may be performed as a "pseudo open-loop" process, using a read back from the DRAM system 100 to the SoC 102. As seen in FIG. 2, a setup command (CMD) 200 may be communicated from the SoC 102 to the DRAM system 100 to a selected one of the ports 106(0)-106(X). A write command (WRITE CMD) 202 is then provided to the DRAM system 100 to send a training signal (not shown) to the selected one of the ports 106(0)-106(X). Next, a read command (READ CMD) 204 is provided to the DRAM system 100, and a readback 206 occurs as the training signal is read back to the SoC 102 from the selected one of the ports 106(0)-106(X) of the DRAM system 100. A training module (not shown) of the SoC 102 then evaluates the training signal that has been read back from the selected one of the ports 106(0)-106(X). Based on the evaluation, the training signal may be incremented (INC) or decremented (DEC) (as indicated by TRAINING INC/DEC 208) or otherwise modified, and the process iterates until an optimal result is achieved. The hardware parameter for the selected one of the ports 106(0)-106(X) may then be set for future use of the selected one of the ports 106(0)-106(X) based on the optimal result.

While the aspects illustrated by FIGS. 1 and 2 may provide effective training of the DRAM system 100, the process for training may be slow, as the training signal must be received by the DRAM system 100, written to the memory array 114, and then read from the memory array 114 and transmitted by the DRAM system 100. Moreover, because the training process of FIG. 2 generally takes place during startup of the SoC 102, the process may require significant boot memory, which may cause software to incur additional overhead.

Figure 3:
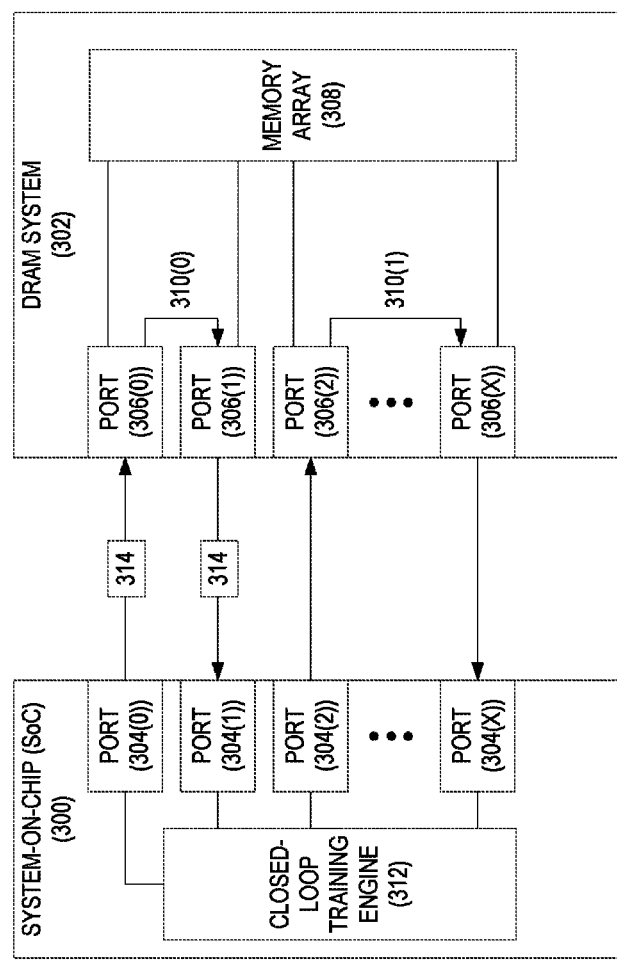
FIG. 3 is a block diagram of an exemplary SoC and DRAM system disclosed herein for providing memory training using a port-to-port loopback connection.

In this regard, FIG. 3 illustrates an exemplary SoC 300 and DRAM system 302 disclosed herein for providing memory training using a port-to-port loopback connection, thus avoiding the need to access the memory array 114 of the DRAM system 100 of FIG. 1 during training. As seen in FIG. 3, the SoC 300 and the DRAM system 302 provide elements corresponding to the elements of the SoC 102 and the DRAM system 100 of FIG. 1, including ports 304(0)-304(X) of the SoC 300 and ports 306(0)-306(X) and a memory array 308 of the DRAM system 302. The DRAM system 302 further provides loopback connections 310(0)-310(1), which couple adjacent ports 306(0)-306(1) and 306(2)-306(X), respectively. The SoC 300 also includes a closed-loop training engine 312, which in some aspects may send training signals 314 to the DRAM system 302 and evaluate the training signals 314 received from the DRAM system 302, as discussed in greater detail below with respect to FIG. 5.

In some aspects, training using the SoC 300 and the DRAM system 302 of FIG. 3 includes sending the training signal 314 to a first port (e.g., port 306(0)) of the DRAM system 302. The training signal 314 is then relayed to a second port (e.g., port 306(1)) of the DRAM system 302 via a loopback connection (e.g., loopback connection 310(0)), and sent back to the SoC 300. The training signal 314 received from the second port 306(1) is then compared to the training signal 314 sent to the first port 306(0) for training evaluation. Because the training signal 314 does not need to be written to the memory array 308, the port-to-port training of FIG. 3 may be considered "closed-loop" in contrast to the conventional training process of FIG. 2. In some aspects, the loopback connections 310(0)-310(1) may be bi-directional. For example, in a first training phase, a training signal 314 may be sent from the SoC 300 to the port 306(0) and received from the port 306(1), while in a second training phase, a training signal 314 may be sent to the port 306(1) and received from the port 306(0).

Figure 4:
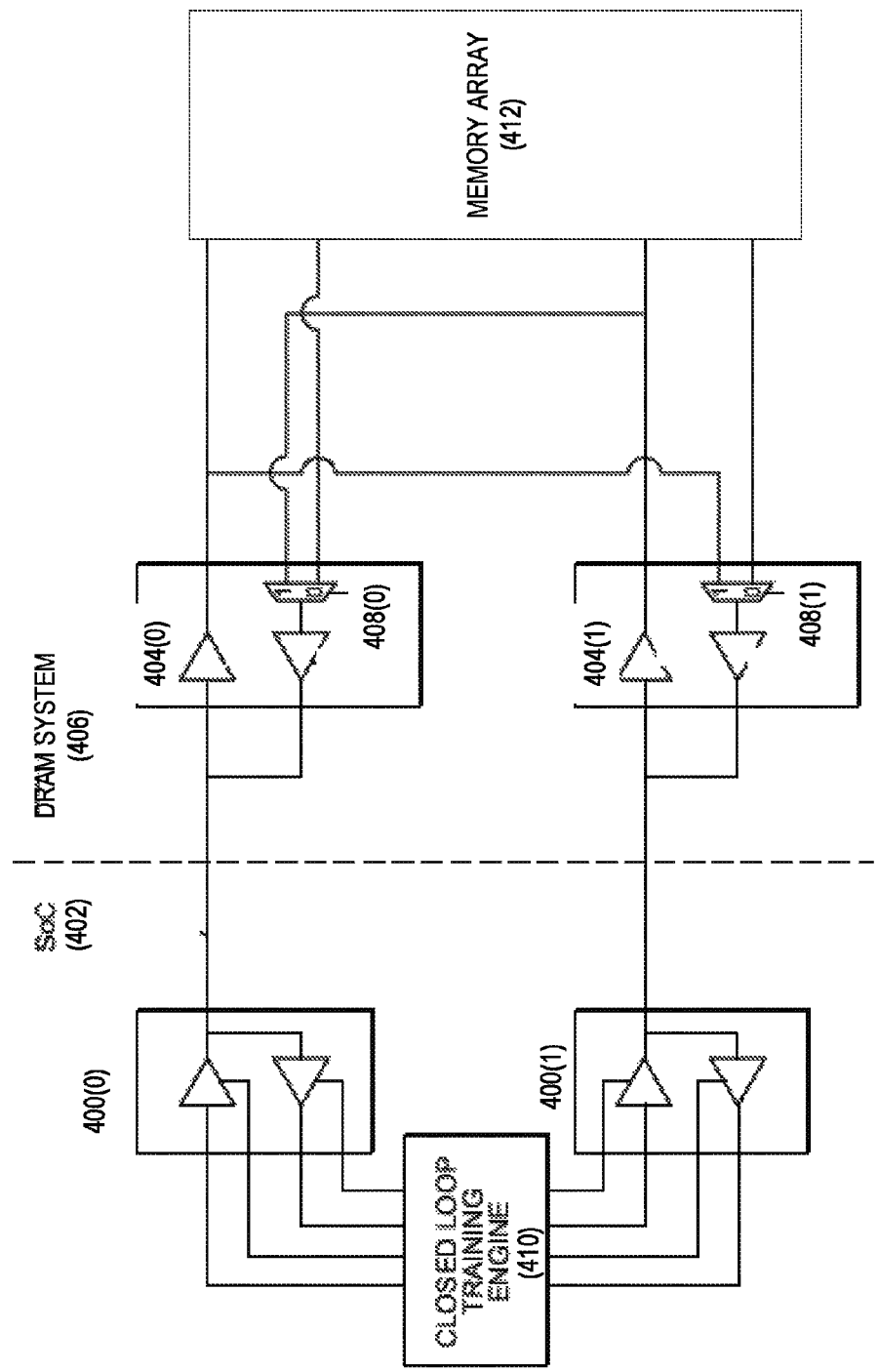
FIG. 4 is a detailed circuit diagram of an exemplary implementation of the SoC and DRAM system of FIG. 3.

An exemplary implementation of the loopback connections 310(0)-310(1) of FIG. 3 is illustrated in FIG. 4. In FIG. 4, ports 400(0)-400(1) of an SoC 402 are connected to ports 404(0)-404(1) of a DRAM system 406. Each of the ports 404(0) and 404(1) of the DRAM system 406 includes a multiplexer 408(0) and 408(1), respectively. A closed-loop training engine 410 of the SoC 402 may place the DRAM system 406 in a loopback mode in which the multiplexers 408(0)-408(1) select data from the adjacent port 404(0), 404(1) rather than retrieving data from a memory array 412 of the DRAM system 406. In this manner, the SoC 402 may receive a training signal (not shown) via loopback rather than data from the memory array 412. In an exemplary aspect, and as illustrated, the multiplexer 408(0) may be set to a value of "1" for loopback from port 404(1) to port 404(0), and the multiplexer 408(1) may be set to a value of "1" for loopback from port 404(0) to port 404(1). It is to be understood that other circuitry may be provided in some aspects to effectuate loopback connections without departing from the scope of the present disclosure.

Figure 5:
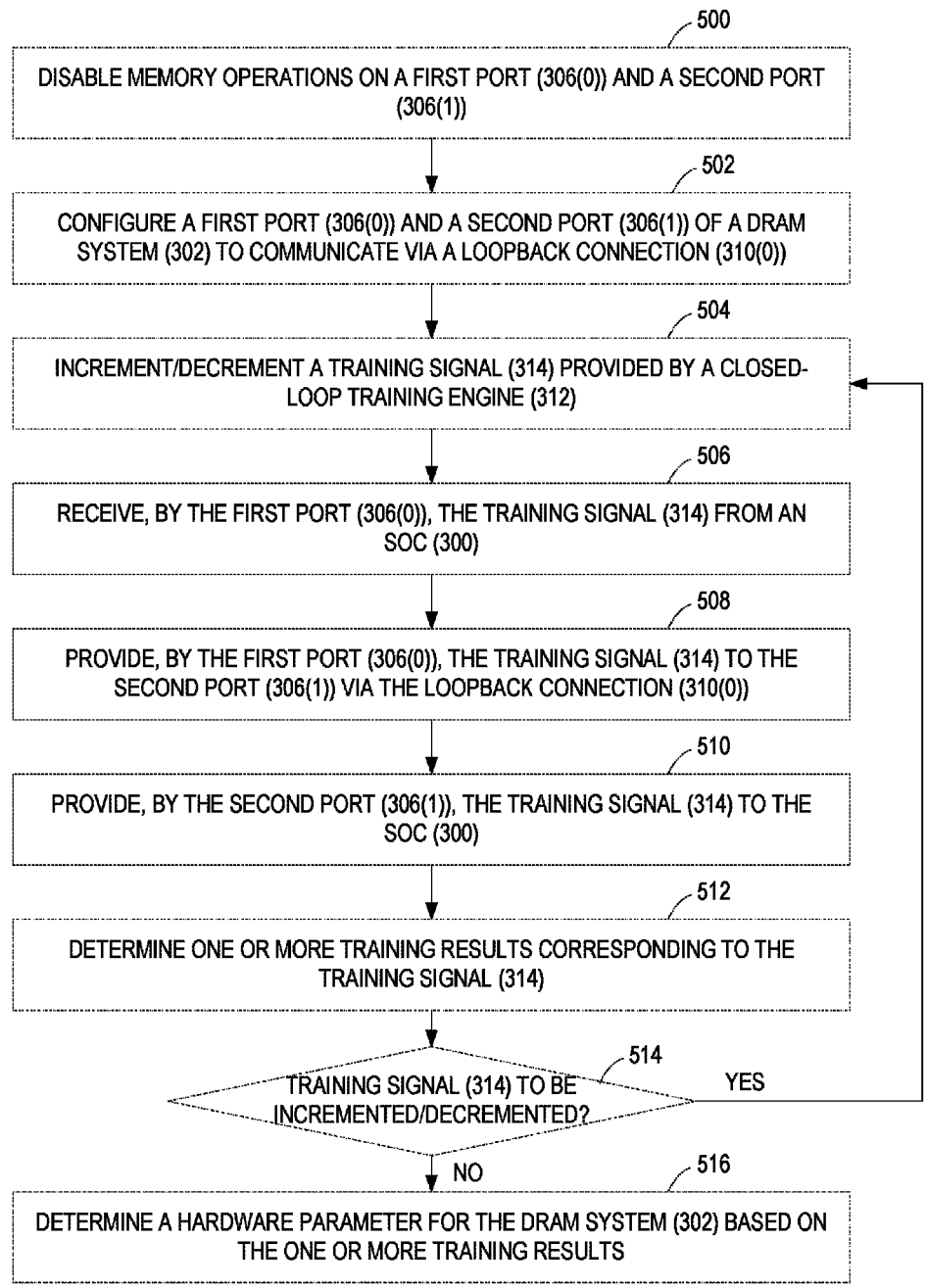
FIG. 5 is a flowchart illustrating exemplary operations for providing memory training using a port-to-port loopback connection.

FIG. 5 is a flowchart illustrating exemplary operations of the SoC 300 and the DRAM system 302 of FIG. 3 for providing memory training using a port-to-port loopback connection. In describing FIG. 5, elements of FIG. 3 are referred to for the sake of clarity. In FIG. 5, operations begin with the SoC 300 optionally disabling memory operations (not shown) on the first port 306(0) and the second port 306(1) (block 500). The SoC 300 may then configure the first port 306(0) and the second port 306(1) of the DRAM system 302 to communicate via the loopback connection 310(0) (block 502). In this manner, the first and second ports 306(0) and 306(1) may be used for training, while the ports 306(2)-306(X) may continue to be used for mission-mode communications between the SoC 300 and the DRAM system 302.

The SoC 300 may then increment or decrement the training signal 314 provided by the closed-loop training engine 312 (block 504). In some aspects, the training signal 314 may initially represent a low value or a high value for a range of one or more incremental training signal 314 values. The training signal 314 may correspond to one or more of a timing training parameter or a voltage training parameter, as non-limiting examples. The first port 306(0) then receives the training signal 314 from the SoC 300 (e.g., the closed-loop training engine 312) (block 506). The first port 306(0) in turn provides the training signal 314 to the second port 306(1) via the loopback connection 310(0) (block 508). The second port 306(1) then provides the training signal 314 to the SoC 300 (e.g., to the closed-loop training engine 312) (block 510). In this manner, the closed-loop training engine 312 in some aspects may transmit the training signal 314 via loopback while measuring attributes of the DRAM system 302 performance. In some aspects, the training signal 314 may be received by the second port 306(1), provided to the first port 306(0) via the loopback connection 310(0), and provided to the SoC 300 by the first port 306(0). This alternate loopback path may be employed instead of or in addition to the loopback path described above.

Upon receiving the training signal 314 from the second port 306(1), the closed-loop training engine 312 may determine one or more training results corresponding to the training signal 314 (block 512). The training result(s) may comprise, as non-limiting examples, the number of clock cycles elapsed and/or the number of errors detected during transmission and reception of the training signal 314 by the closed-loop training engine 312. The SoC 300 may then determine whether the training signal 314 should be further incremented or decremented (block 514). For example, the SoC 300 may be in the process of carrying out a "parameter sweep," in which a series of possible training signals 314 are tested iteratively. Thus, if the SoC 300 determines at decision block 514 that the training signal 314 should be further incremented or decremented (i.e., the parameter sweep is not complete), processing returns to block 504, and the process repeats for an incremented or decremented value of the training signal 314. In this manner, the training signal 314 may be iteratively modified from an initial low value to increasingly higher values, or vice versa, and a training result may be recorded for each training signal 314.

However, if the SoC 300 determines at decision block 514 that the training signal 314 should not be further incremented or decremented, then the SoC 300 may determine a hardware parameter for the DRAM system 302 based on the one or more training results (block 516). In some aspects, determining the hardware parameter for the DRAM system 302 may include the SoC 300 identifying the training signal 314 that was a first in a series of one or more incremental training signals to return a timing exception or error message (i.e., a first-failing incremental training signal). The SoC 300 may further identify the training signal 314 that was last in a series of one or more incremental training signals to return a timing exception or error message (i.e., a last-failing incremental training signal). The SoC 300, in some aspects, may then determine the hardware parameter based on a median or midpoint between the first-failing incremental training signal and the last-failing incremental training signal.

It is to be understood that the operations described above with respect to FIG. 5 may be repeated for all or a subset of the ports 306(0)-306(X). It is to be further understood that after the hardware parameter (i.e., a timing parameter or a voltage parameter, as non-limiting examples) has been determined for one of the ports 306(0)-306(X), the operations described above may be repeated for the same one of the ports 306(0)-306(X) with respect to a different hardware parameter.

Providing memory training of DRAM systems using port-to-port loopbacks according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 6:
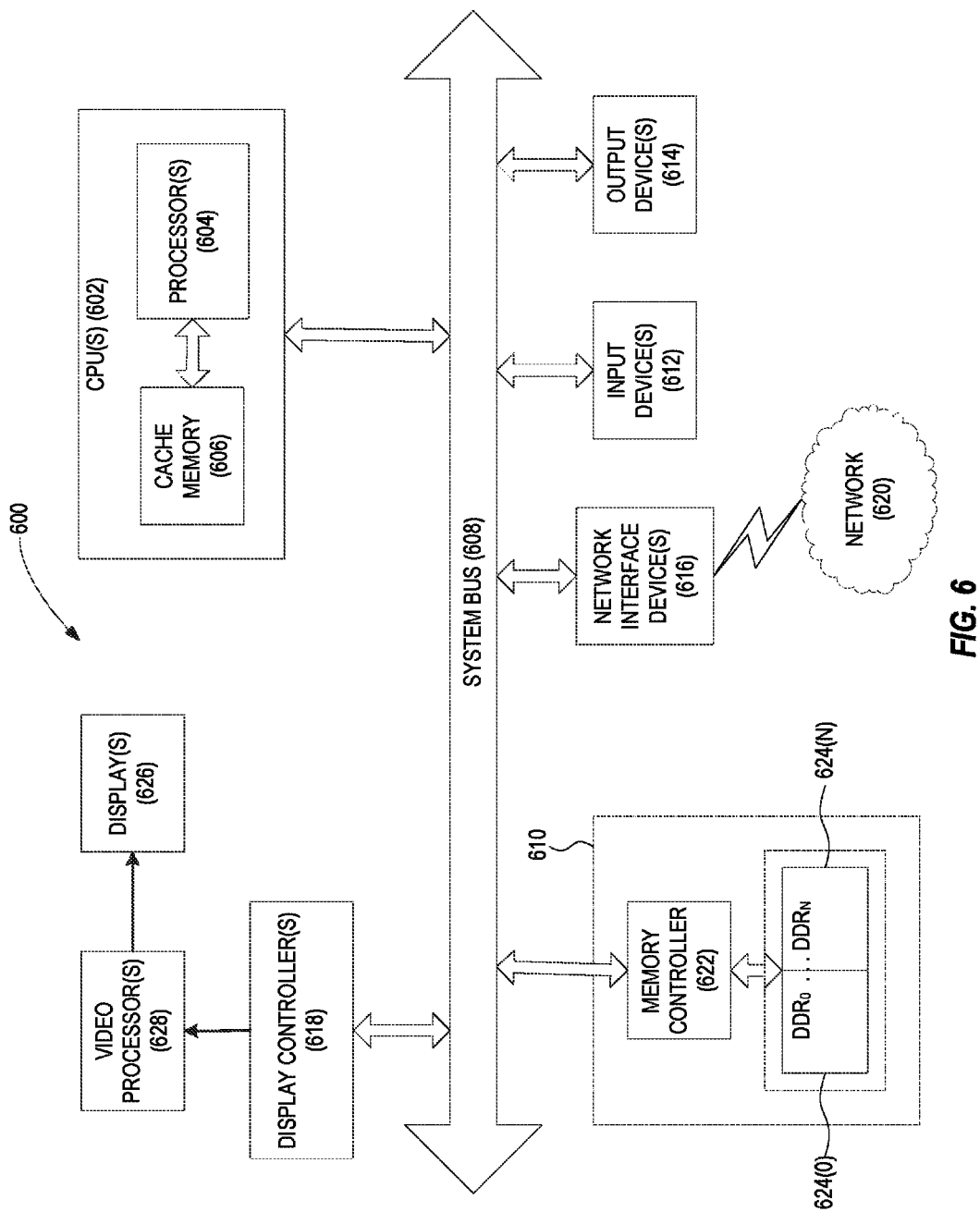
FIG. 6 is a block diagram of an exemplary processor-based system that may include the SoC and/or DRAM system of FIGS. 3 and 4 for providing memory training using a port-to-port loopback connection.

In this regard, FIG. 6 illustrates an example of a processor-based system 600 that may provide the SoC 300 and/or the DRAM system 302 according to the aspects in FIG. 3. In some aspects, the processor-based system 600 may comprise the SoC 300 of FIG. 3. In the example of FIG. 6, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple devices included in the processor-based system 600. As is well known, the CPU(s) 602 communicates with these other devices by exchanging address, control, and data information over the system bus 608.

Other devices can be connected to the system bus 608. As illustrated in FIG. 6, these devices can include a memory system 610, one or more input devices 612, one or more output devices 614, one or more network interface devices 616, and one or more display controllers 618, as examples. The input device(s) 612 can include any type of input device, including but not limited to input keys, switches, voice processors, etc. The output device(s) 614 can include any type of output device, including but not limited to audio, video, other visual indicators, etc. The network interface device(s) 616 can be any device configured to allow exchange of data to and from a network 620. The network 620 can be any type of network, including but not limited to a wired or wireless network, a private or public network, a local area network (LAN), a wide local area network (WLAN), or the internet. The network interface device(s) 616 can be configured to support any type of communications protocol desired. The memory system 610 can include a memory controller 622 and one or more memory units 624(0)-624(N). In some aspects, the memory system 610 may include the DRAM system 302 according to the exemplary aspects of FIG. 3.

The CPU(s) 602 may also be configured to access the display controller(s) 618 over the system bus 608 to control information sent to one or more displays 626. The display controller(s) 618 sends information to the display(s) 626 to be displayed via one or more video processors 628, which process the information to be displayed into a format suitable for the display(s) 626. The display(s) 626 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for providing memory training for a dynamic random access memory (DRAM) system, comprising:
    disabling memory operations on a first port of the DRAM system and a second port of the DRAM system of a plurality of ports of the DRAM system;
    configuring the first port of the DRAM system and the second port of the DRAM system to communicate via a loopback connection;
    receiving, by the first port of the DRAM system, a signal from a System-on-Chip (SoC);
    providing, by the first port of the DRAM system, the signal to the second port of the DRAM system via the loopback connection; and
    providing, by the second port of the DRAM system, the signal to the SoC.

2. The method of claim 1, wherein:
    receiving the signal comprises receiving the signal from a closed-loop engine of the SoC; and
    providing the signal to the SoC comprises providing the signal to the closed-loop engine of the SoC.

3. The method of claim 2, wherein the signal is one of one or more incremental signals provided by the closed-loop engine;
    the method further comprising:
        determining one or more results corresponding to the one or more incremental signals; and
        determining a hardware parameter for the DRAM system based on the one or more results.

4. The method of claim 3, wherein determining the hardware parameter comprises determining a median between a first-failing incremental signal of the one or more incremental signals and a last-failing incremental signal of the one or more incremental signals.

5. The method of claim 3, wherein determining the one or more results corresponding to the one or more incremental signals comprises conducting a parameter sweep.

6. The method of claim 1, wherein the signal comprises one or more of a timing parameter and a voltage parameter.

7. The method of claim 1, wherein the first port and the second port are adjacent within the DRAM system.

8. The method of claim 1, wherein the loopback connection is bi-directional.

9. The method of claim 1, wherein each of the first port and the second port comprises a multiplexer (MUX) operative to select the loopback connection.

10. A system for providing memory training for a dynamic random access memory (DRAM) system, comprising:
    a System-on-Chip (SoC) communicatively coupled to a DRAM system;
    the DRAM system comprising a plurality of ports comprising a first port and a second port communicatively coupled via a loopback connection;
    wherein the DRAM system is configured to:
        receive, by the first port of the DRAM system, a signal from the SoC;
        provide, by the first port of the DRAM system, the signal to the second port of the DRAM system via the loopback connection; and
        provide, by the second port of the DRAM system, the signal to the SoC; and
    wherein the SoC is configured to:
        disable memory operations on the first port and the second port; and
        configure the first port and the second port to communicate via the loopback connection.

11. The system of claim 10, wherein the SoC comprises a closed-loop engine;
    wherein the DRAM system is further configured to:
        receive the signal from the closed-loop engine of the SoC; and
        provide the signal to the closed-loop engine of the SoC.

12. The system of claim 11, wherein the closed-loop engine is configured to:
    provide one or more incremental signals comprising the signal;
    determine one or more results corresponding to the one or more incremental signals; and
    determine a hardware parameter for the DRAM system based on the one or more results.

13. The system of claim 12, wherein the closed-loop engine is configured to determine the hardware parameter by determining a median between a first-failing incremental signal of the one or more incremental signals and a last-failing incremental signal of the one or more incremental signals.

14. The system of claim 12, wherein the closed-loop engine is configured to determine the one or more results corresponding to the one or more incremental signals by conducting a parameter sweep.

15. The system of claim 10, wherein the DRAM system is configured to receive the signal comprising one or more of a timing parameter and a voltage parameter.

16. The system of claim 10, wherein the first port and the second port are adjacent within the DRAM system.

17. The system of claim 10, wherein the loopback connection is bi-directional.

18. The system of claim 10, wherein each of the first port and the second port comprises a multiplexer (MUX) configured to select the loopback connection.

19. An apparatus comprising a dynamic random access memory (DRAM) system, configured to:
    disable memory operations on a first port of the DRAM system and a second port of the DRAM system of a plurality of ports of the DRAM system;
    configure the first port of the DRAM system and the second port of the DRAM system to communicate via a loopback connection;
    receive, by the first port of the DRAM system, a signal from a System-on-Chip (SoC);
    provide, by the first port of the DRAM system, the signal to the second port via the loopback connection; and provide, by the second port of the DRAM system, the signal to the SoC.

\* \* \* \* \*